US012610541B2

(12) United States Patent
Lee et al.

(10) Patent No.: US 12,610,541 B2
(45) Date of Patent: Apr. 21, 2026

(54) ONE-TIME PROGRAMMABLE MEMORY STRUCTURE

(71) Applicant: United Microelectronics Corp., Hsinchu (TW)

(72) Inventors: Kuo-Hsing Lee, Hsinchu County (TW); Chi-Horn Pai, Tainan City (TW); Chang Chien Wong, Tainan City (TW); Sheng-Yuan Hsueh, Tainan City (TW); Ching Hsiang Tseng, Tainan City (TW); Shih-Chieh Hsu, New Taipei City (TW)

(73) Assignee: United Microelectronics Corp., Hsinchu (TW)

( * ) Notice: Subject to any disclaimer, the term of this patent is extended or adjusted under 35 U.S.C. 154(b) by 467 days.

(21) Appl. No.: 18/470,447

(22) Filed: Sep. 20, 2023

(65) Prior Publication Data

US 2024/0015958 A1    Jan. 11, 2024

Related U.S. Application Data

(63) Continuation-in-part of application No. 17/323,863, filed on May 18, 2021, now Pat. No. 11,825,648.

(30) Foreign Application Priority Data

Apr. 16, 2021    (CN) .......................... 202110412932.7

(51) Int. Cl.
*H10B 20/25*        (2023.01)
(52) U.S. Cl.
CPC .................................... *H10B 20/25* (2023.02)
(58) Field of Classification Search
CPC ...... H10B 20/25; H10D 1/692; H10W 20/491
See application file for complete search history.

(56) References Cited

U.S. PATENT DOCUMENTS

| 6,235,573 | B1 | 5/2001 | Lee et al. |
| 6,898,105 | B2 | 5/2005 | Sakai et al. |

(Continued)

FOREIGN PATENT DOCUMENTS

| CN | 104396014 | 3/2015 |
| CN | 105514112 | 4/2016 |
| WO | 2020014859 | 1/2020 |

OTHER PUBLICATIONS

"Notice of allowance of China Counterpart Application", issued on Aug. 1, 2025, p. 1-p. 4.

(Continued)

*Primary Examiner* — Allison Bernstein
(74) *Attorney, Agent, or Firm* — JCIPRNET

(57)        ABSTRACT

A one-time programmable memory structure comprises: A transistor includes a gate. A capacitor includes a first electrode, a second electrode, and an insulating layer. The second electrode is disposed on the first electrode. A top surface of the first electrode and a top surface of the gate are located on a same plane perpendicular to a direction of the first electrode toward the second electrode. An interconnect structure is electrically connected between the transistor and the first electrode of the capacitor. The interconnect structure is electrically connected to the first electrode at a top surface of the first electrode. A resistor comprises a conductive layer. Top and bottom surfaces of the conductive layer are respectively located on a same plane, perpendicular to the direction of the first electrode toward the second electrode, with the top and bottom surfaces of the gate.

19 Claims, 18 Drawing Sheets

(56) References Cited

U.S. PATENT DOCUMENTS

| | | | |
|---|---|---|---|
| 7,084,452 B2 | 8/2006 | Kim | |
| 8,530,283 B2 | 9/2013 | Agam et al. | |
| 9,105,338 B2 | 8/2015 | Hidaka et al. | |
| 9,502,424 B2 * | 11/2016 | Wang | G11C 17/16 |
| 9,953,990 B1 | 4/2018 | Horch et al. | |
| 11,854,632 B2 * | 12/2023 | Lee | H10B 20/25 |
| 12,245,424 B2 * | 3/2025 | Lee | H10D 1/716 |
| 2004/0108539 A1 | 6/2004 | Kim | |
| 2009/0014766 A1 | 1/2009 | Kim | |
| 2012/0292682 A1 | 11/2012 | Pan et al. | |
| 2014/0001568 A1 | 1/2014 | Wang et al. | |

OTHER PUBLICATIONS

"Office Action of China Counterpart Application", issued on Apr. 25, 2025, p. 1-p. 8.

\* cited by examiner

ONE-TIME PROGRAMMABLE MEMORY STRUCTURE

CROSS-REFERENCE TO RELATED APPLICATION

This application is a continuation-in-part application of and claims the priority benefit of U.S. application Ser. No. 17/323,863, filed on May 18, 2021, which claims the priority benefit of China application no. 202110412932.7, filed on Apr. 16, 2021. The entirety of each of the above-mentioned patent applications is hereby incorporated by reference herein and made a part of this specification.

BACKGROUND OF THE INVENTION

Field of the Invention

The invention relates to a memory structure, and particularly relates to a one-time programmable (OTP) memory structure.

Description of Related Art

A current OTP memory has a capacitor that is electrically connected to a transistor. However, since the bottom electrode of the capacitor is a doped region located in the substrate, when programming the OTP memory, the bottom electrode located in the substrate will become a noise source of adjacent devices.

SUMMARY OF THE INVENTION

The invention provides an OTP memory structure, which can effectively prevent the noise source from being generated in the substrate.

The invention provides an OTP memory structure, which includes a substrate, a transistor, a capacitor, an interconnect structure, and a resistor. The substrate comprises a memory region and a resistor region. The transistor is located on the substrate and located in the memory region. The transistor comprises a gate disposed on the substrate. The capacitor is located in the memory region and includes a first electrode, a second electrode, and an insulating layer. The first electrode is disposed above the substrate. The second electrode is disposed on the first electrode. The first electrode is located between the second electrode and the substrate, a top surface of the first electrode and a top surface of the gate are located on a same plane perpendicular to a direction of the first electrode toward the second electrode. The insulating layer is disposed between the first electrode and the second electrode. The interconnect structure is electrically connected between the transistor and the first electrode of the capacitor. The interconnect structure is electrically connected to the first electrode at the top surface of the first electrode. The resistor is located in the resistor region and comprises a conductive layer disposing above the substrate. A top surface of the conductive layer and the top surface of the gate are located on a same plane perpendicular to the direction of the first electrode toward the second electrode, and a bottom surface of the conductive layer and a bottom surface of the gate are located on a same plane perpendicular to the direction of the first electrode toward the second electrode.

According to an embodiment of the invention, in the OTP memory structure, the interconnect structure may be in direct contact with the top surface of the first electrode.

According to an embodiment of the invention, in the OTP memory structure, the transistor may include a gate dielectric layer, a first doped region, and a second doped region. The gate dielectric layer is disposed between the gate and the substrate. The first doped region and the second doped region are located in the substrate on two sides of the gate.

According to an embodiment of the invention, in the OTP memory structure, the first electrode and the gate may be derived from the same material layer.

According to an embodiment of the invention, in the OTP memory structure, the interconnect structure may include a first contact, a second contact, and a conductive line. The first contact is electrically connected to the first doped region. The second contact is electrically connected to the first electrode. The conductive line is electrically connected between the first contact and the second contact.

According to an embodiment of the invention, in the OTP memory structure, the interconnect structure may include a contact. The contact is electrically connected between the first doped region and the first electrode.

According to an embodiment of the invention, in the OTP memory structure, the contact may be in direct contact with the first doped region and the first electrode.

According to an embodiment of the invention, the OTP memory structure may include a plurality of the capacitors electrically connected to the same transistor.

According to an embodiment of the invention, the OTP memory structure may further include an isolation structure. The isolation structure is located in the substrate. The first electrode may be disposed on the isolation structure.

According to an embodiment of the invention, in the OTP memory structure, the conductive layer and the gate may be derived from the same material layer.

The invention provides another OTP memory structure, which includes a substrate, a transistor, a capacitor, an interconnect structure, and a resistor. The substrate comprises a memory region and a resistor region. The transistor is located on the substrate and located in the memory region. The transistor comprises a gate disposed on the substrate. The capacitor is located in the memory region includes a first electrode, a second electrode, and an insulating layer. The first electrode is disposed above the substrate. The second electrode is disposed on the first electrode. The first electrode is located between the second electrode and substrate. A top surface of the first electrode and a top surface of the gate are located on a same plane perpendicular to a direction of the first electrode toward the second electrode. The insulating layer is disposed between the first electrode and the second electrode. The interconnect structure is electrically connected between the transistor and the second electrode of the capacitor. The interconnect structure is electrically connected to the second electrode at the top surface of the second electrode. The first electrode and the gate are derived from a same material layer. The resistor is located in the resistor region and comprises a conductive layer disposed above the substrate. A top surface of the conductive layer and the top surface of the gate are located on a same plane perpendicular to the direction of the first electrode toward the second electrode, and a bottom surface of the conductive layer and a bottom surface of the gate are located on a same plane perpendicular to the direction of the first electrode toward the second electrode.

According to another embodiment of the invention, in the OTP memory structure, the interconnect structure may be in direct contact with the top surface of the second electrode.

According to another embodiment of the invention, in the OTP memory structure, the transistor may include a gate dielectric layer, a first doped region, and a second doped region. The gate dielectric layer is disposed between the gate and the substrate. The first doped region and the second doped region are located in the substrate on two sides of the gate.

According to another embodiment of the invention, in the OTP memory structure, the interconnect structure may include a first contact, a second contact, and a conductive line. The first contact is electrically connected to the first doped region. The second contact is electrically connected to the second electrode. The conductive line is electrically connected between the first contact and the second contact.

According to another embodiment of the invention, in the OTP memory structure, the interconnect structure may include a contact. The contact is electrically connected between the first doped region and the second electrode.

According to another embodiment of the invention, in the OTP memory structure, the contact may be in direct contact with the first doped region and the second electrode.

According to another embodiment of the invention, the OTP memory structure may include a plurality of the capacitors electrically connected to the same transistor.

According to another embodiment of the invention, the OTP memory structure may further include an isolation structure. The isolation structure is located in the substrate. The first electrode may be disposed on the isolation structure.

According to an embodiment of the invention, in the OTP memory structure, the conductive layer and the gate may be derived from the same material layer.

Based on the above description, in the OTP memory structure according to the invention, since the first electrode and the second electrode of the capacitor are both disposed above the substrate, the noise source caused by arranging the electrode of the capacitor in the substrate can be prevented.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

4

Figure 5A:
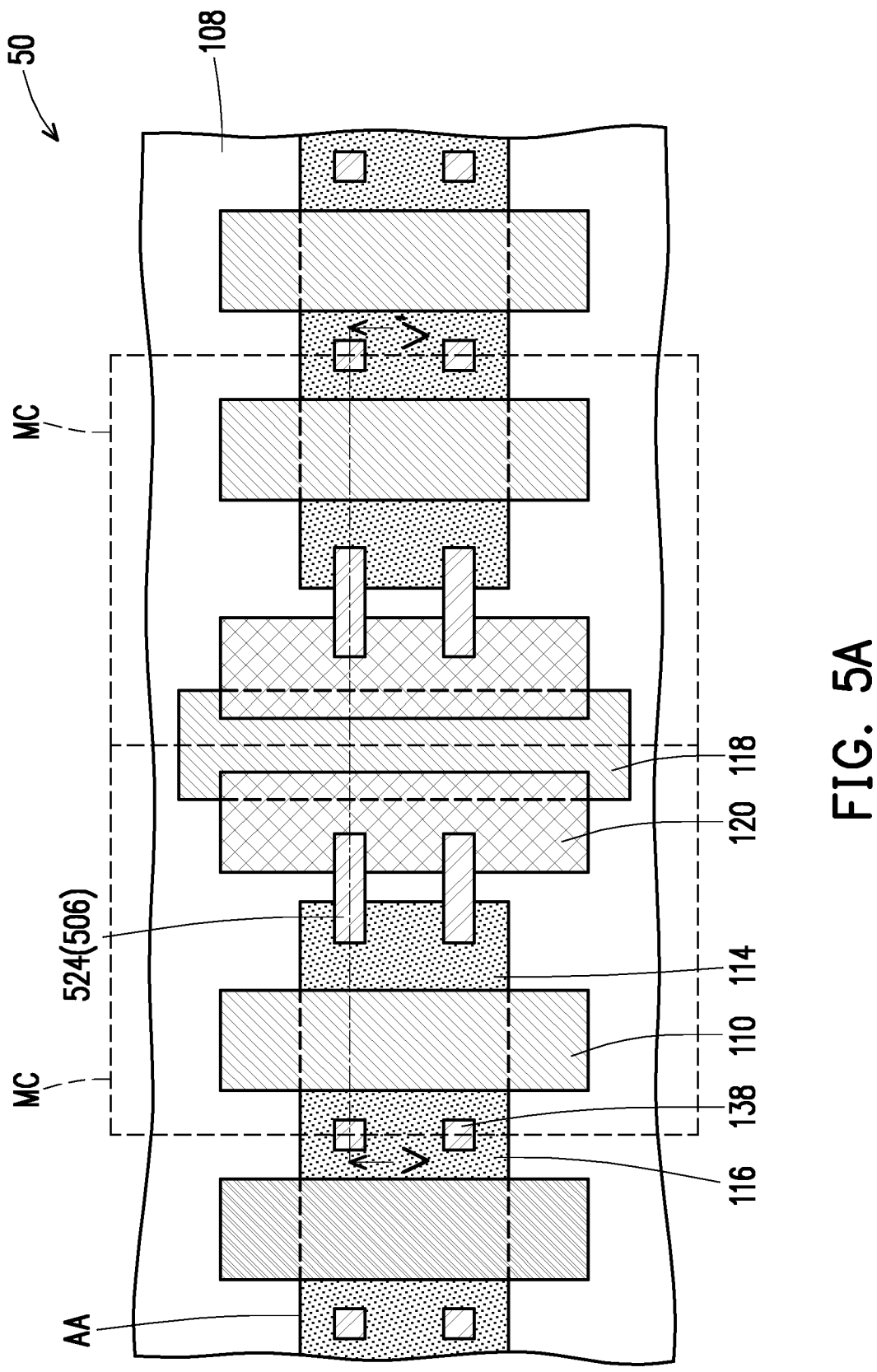
FIG. 5A is a top view illustrating an OTP memory structure according to another embodiment of the invention.
Figure 5B:
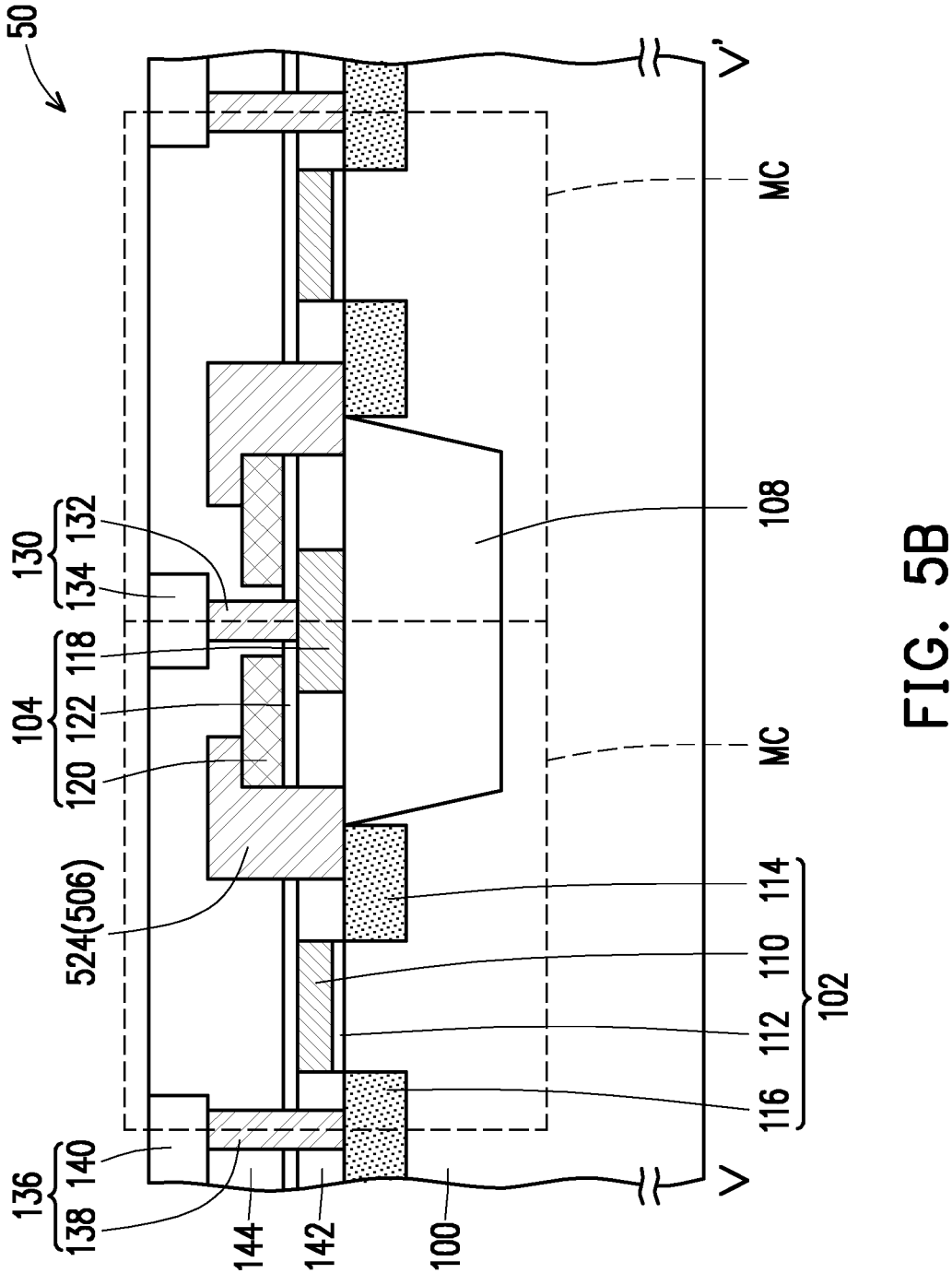

FIG. 5B is a cross-sectional view taken along the section line V-V' in FIG. 5A.

Figure 6A:
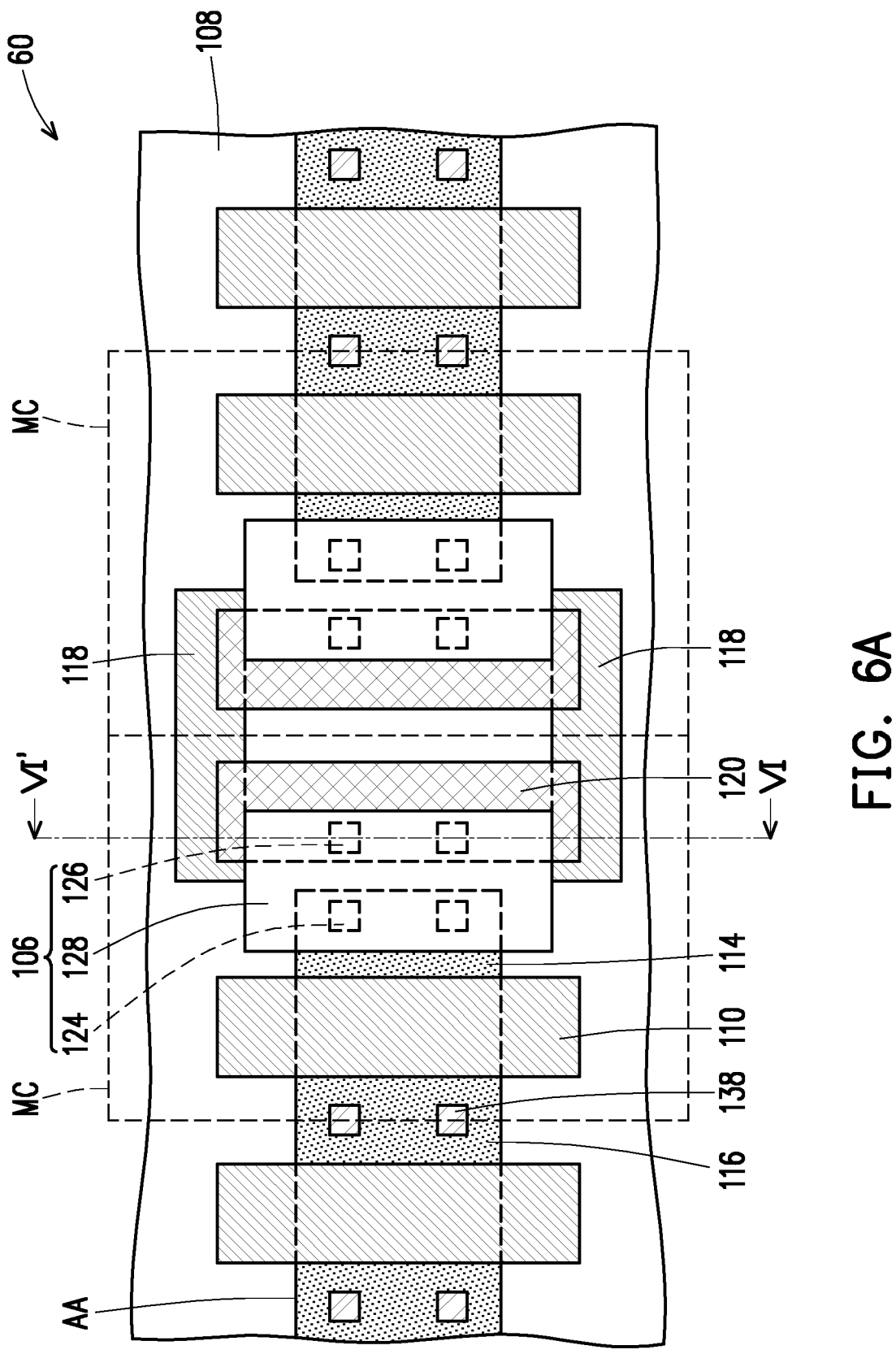

FIG. 6A is a top view illustrating an OTP memory structure according to another embodiment of the invention.

Figure 6B:
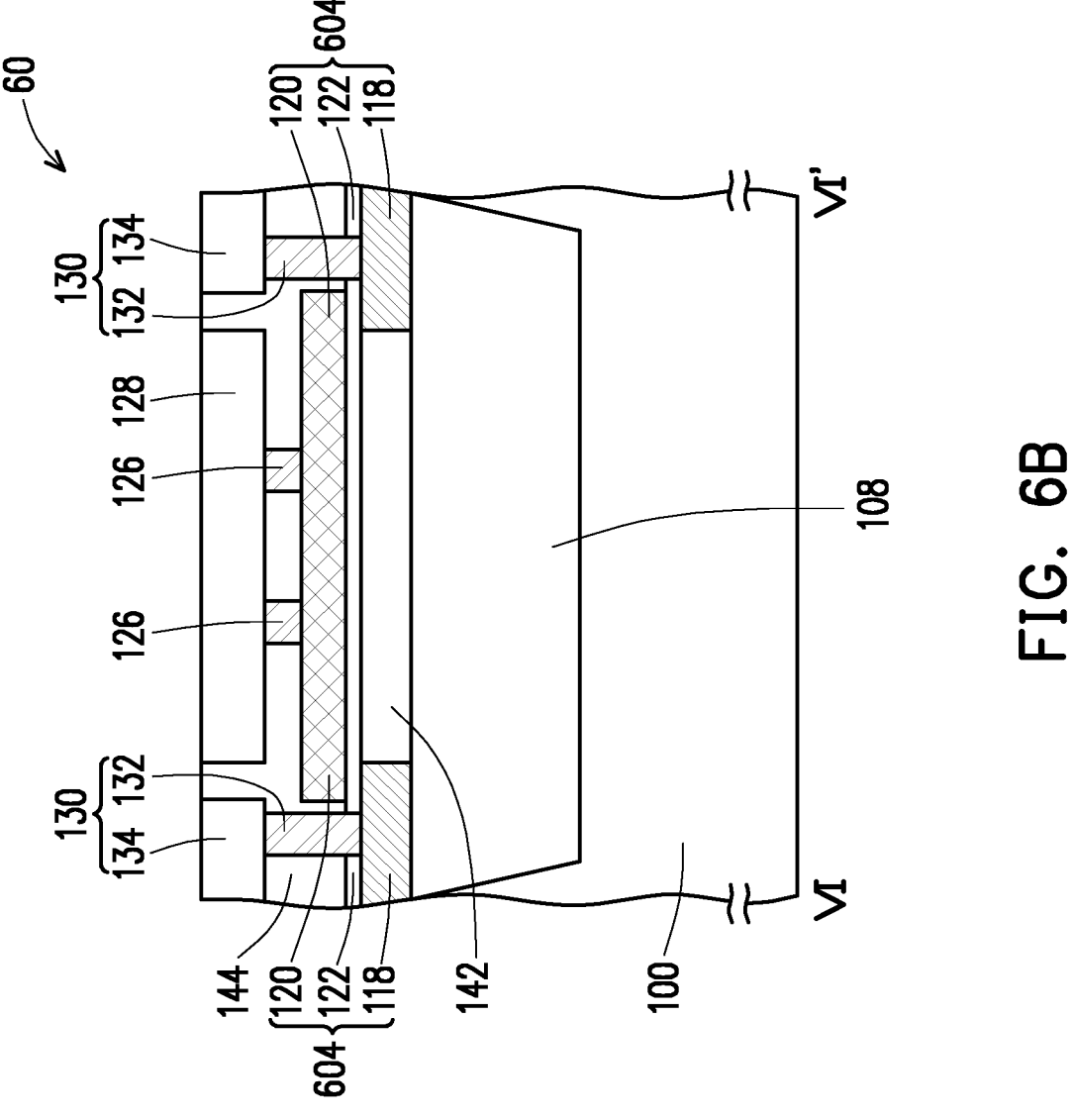

FIG. 6B is a cross-sectional view taken along the section line VI-VI' in FIG. 6A.

Figure 7:
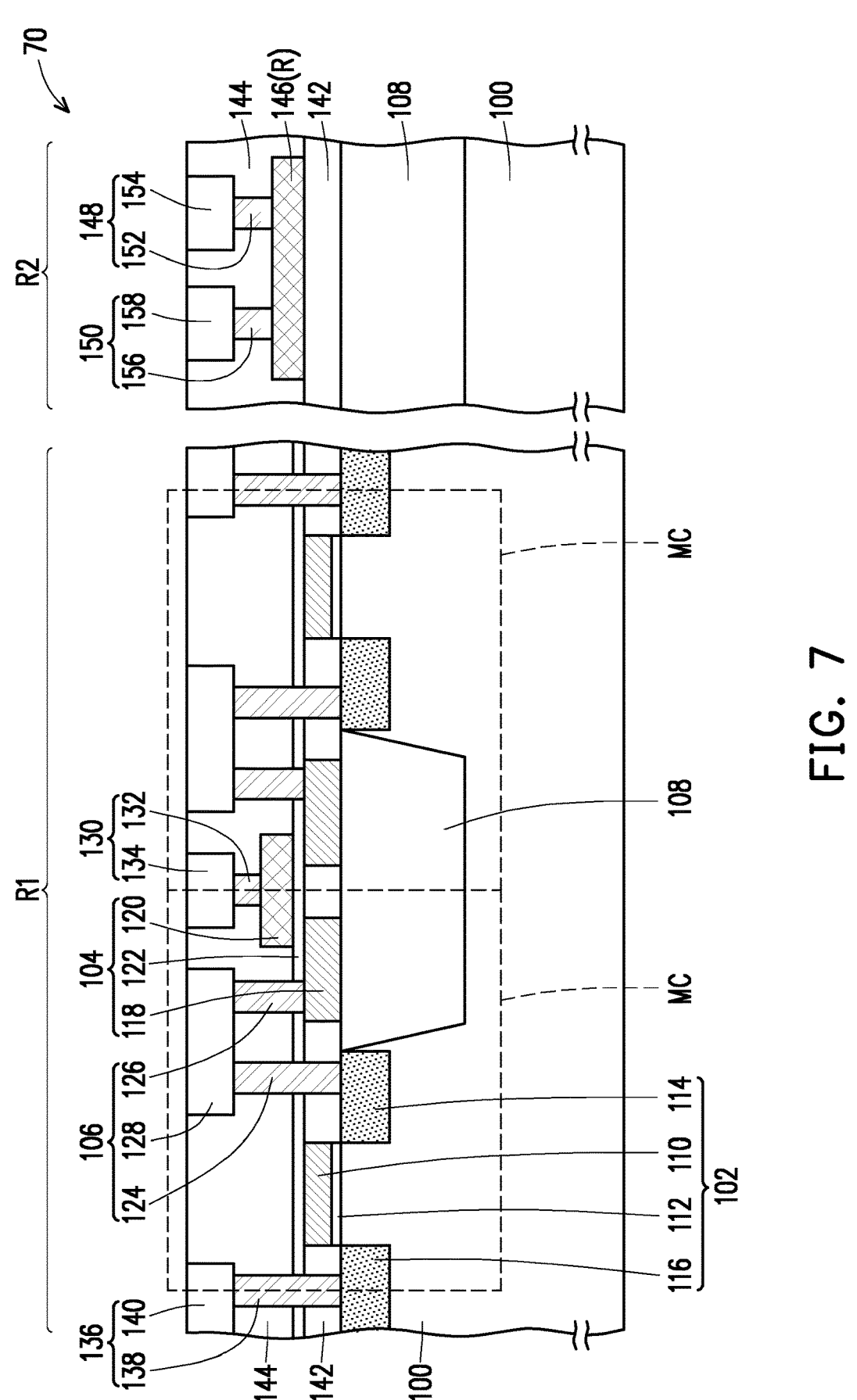

FIG. 7 is a cross-sectional view illustrating an OTP memory structure according to another embodiment of the invention.

Figure 8:
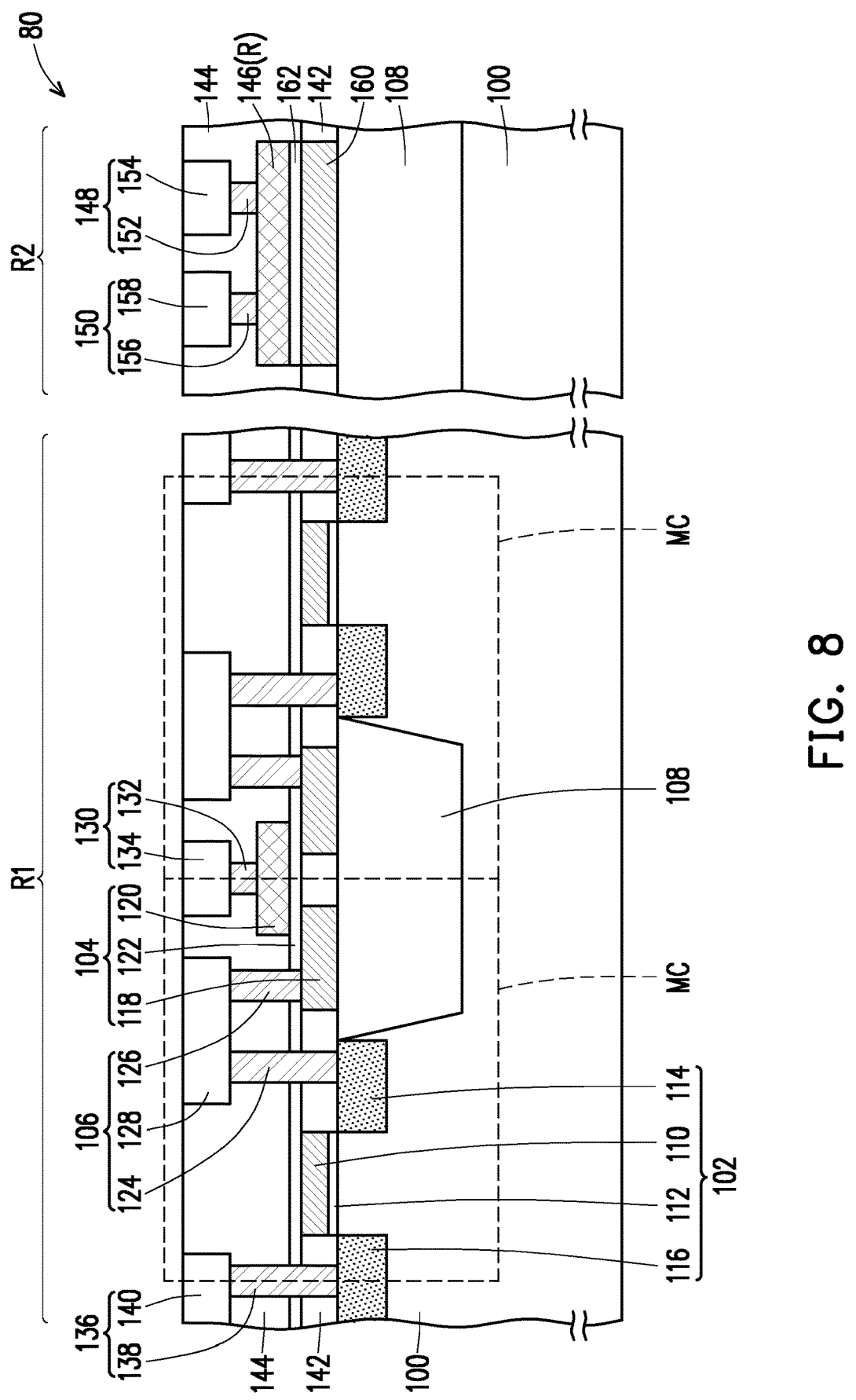

FIG. 8 is a cross-sectional view illustrating an OTP memory structure according to another embodiment of the invention.

Figure 9:
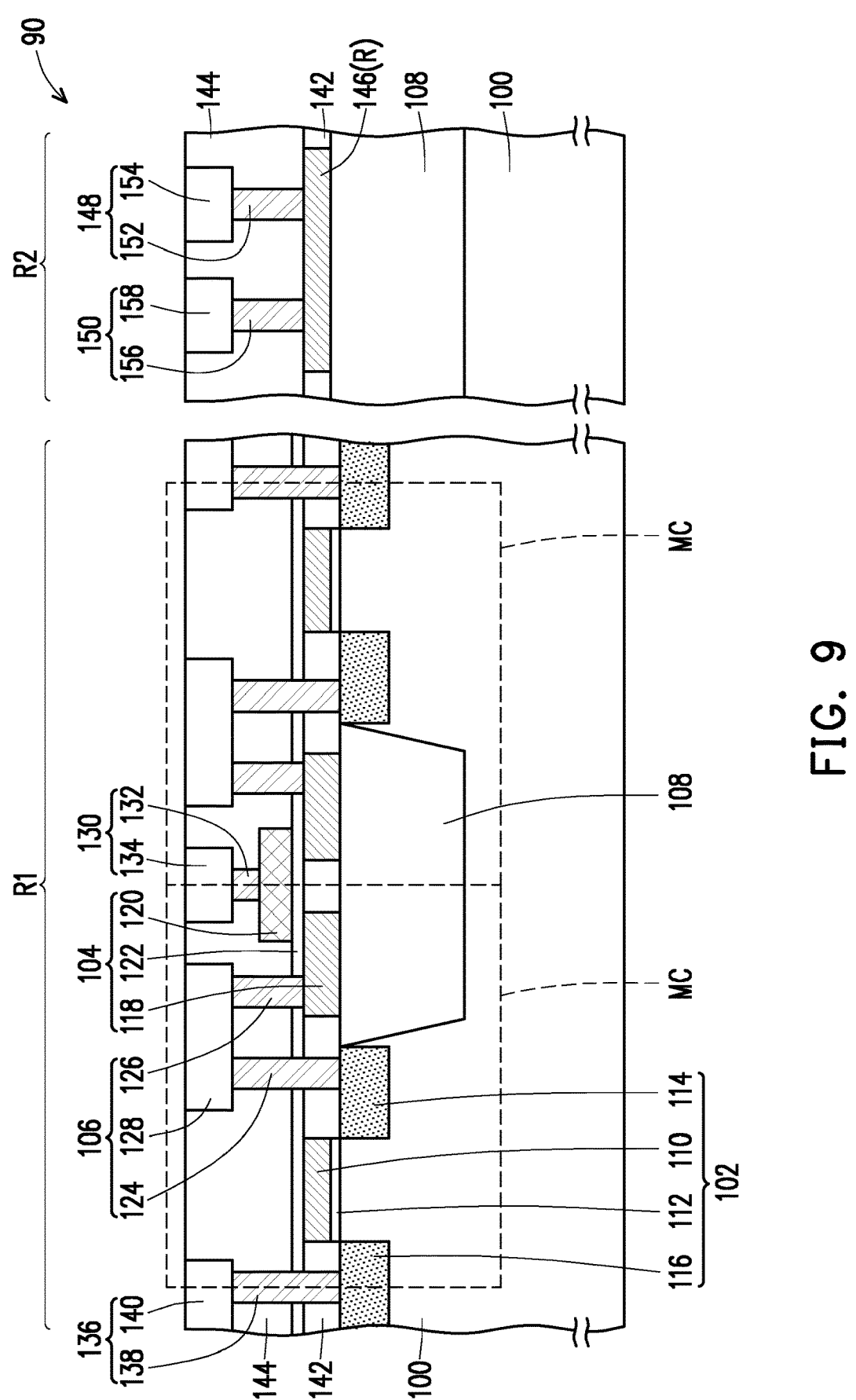

FIG. 9 is a cross-sectional view illustrating an OTP memory structure according to another embodiment of the invention.

Figure 10:
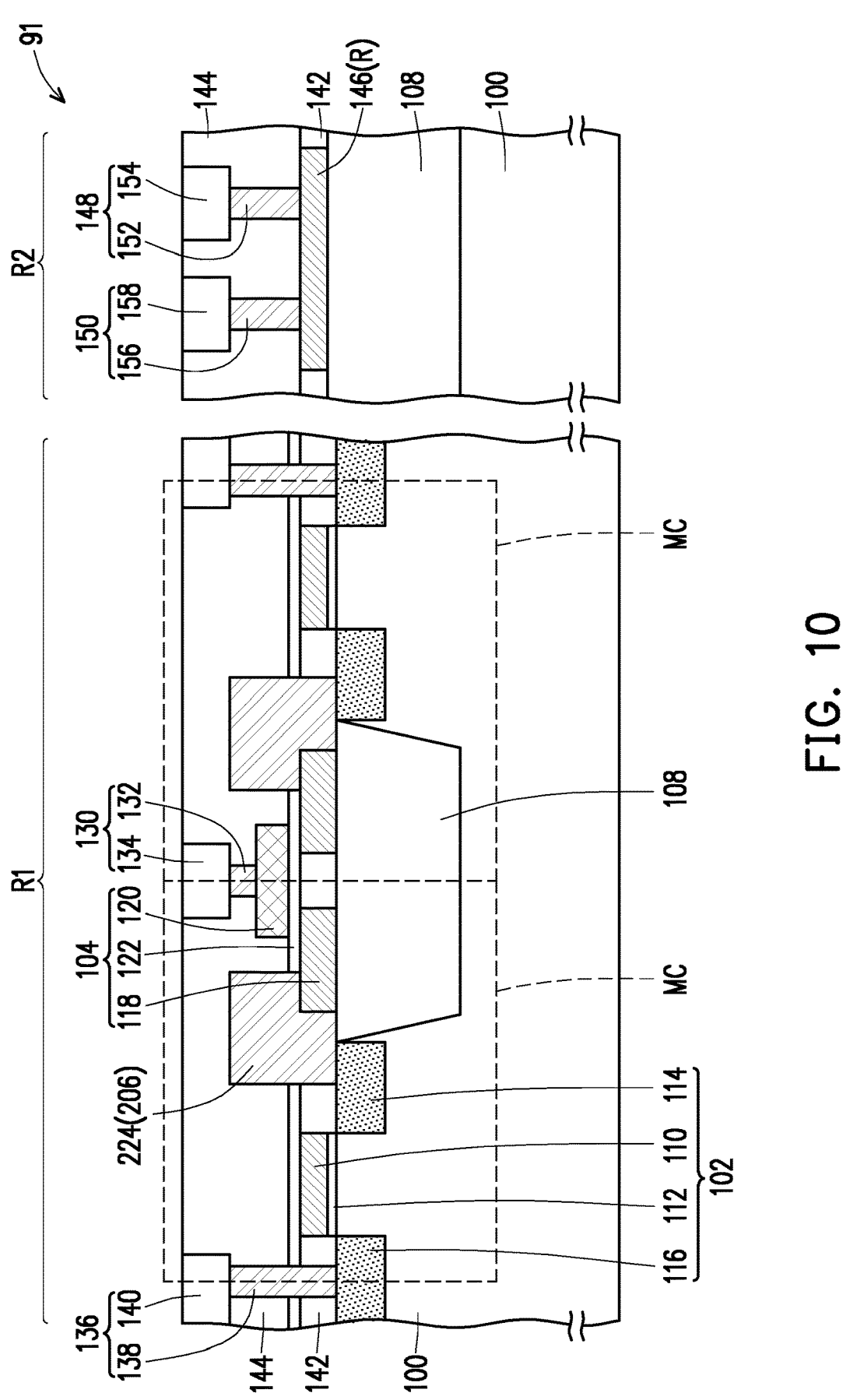

FIG. 10 is a cross-sectional view illustrating an OTP memory structure according to another embodiment of the invention.

Figure 11:
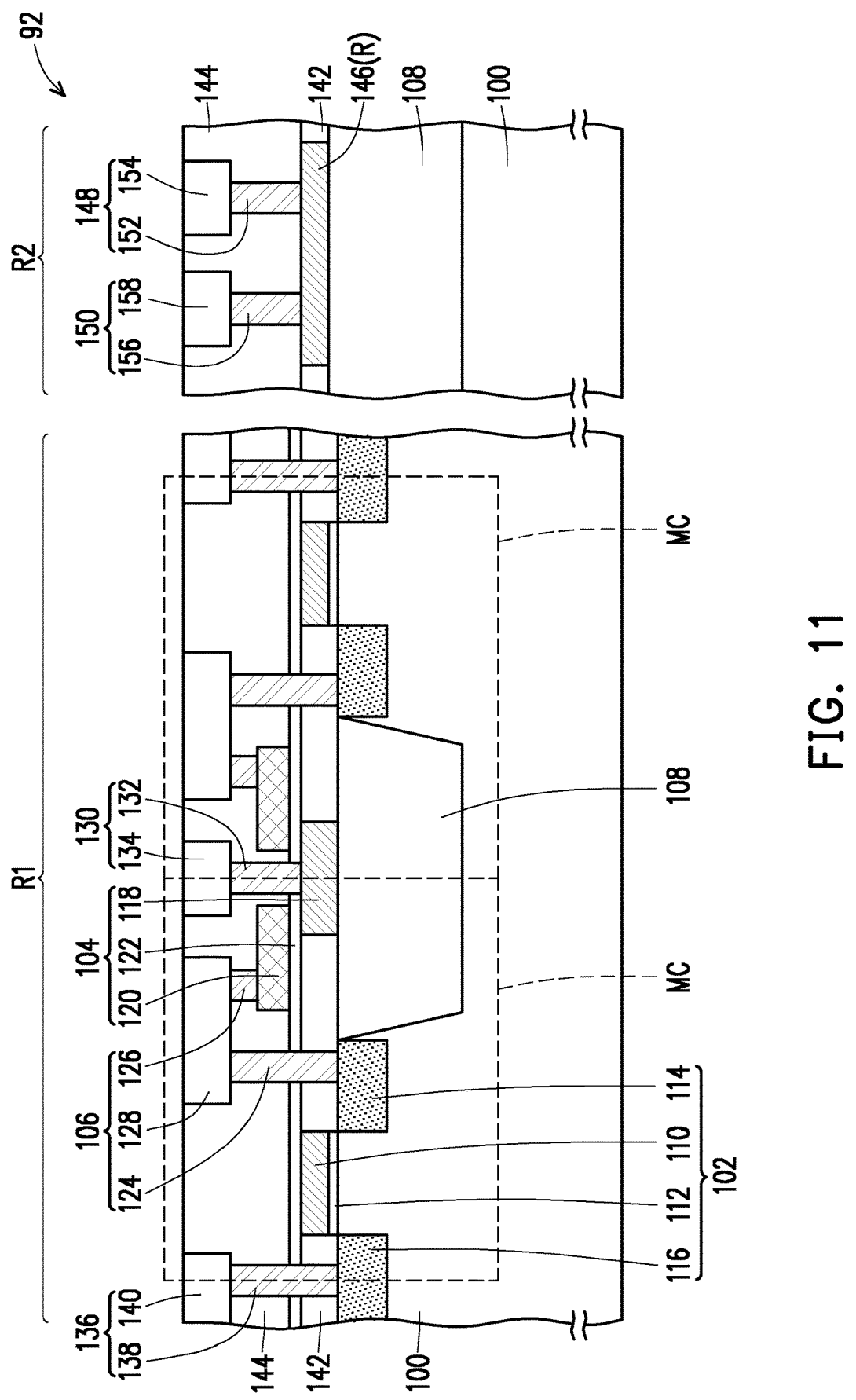

FIG. 11 is a cross-sectional view illustrating an OTP memory structure according to another embodiment of the invention.

Figure 12:
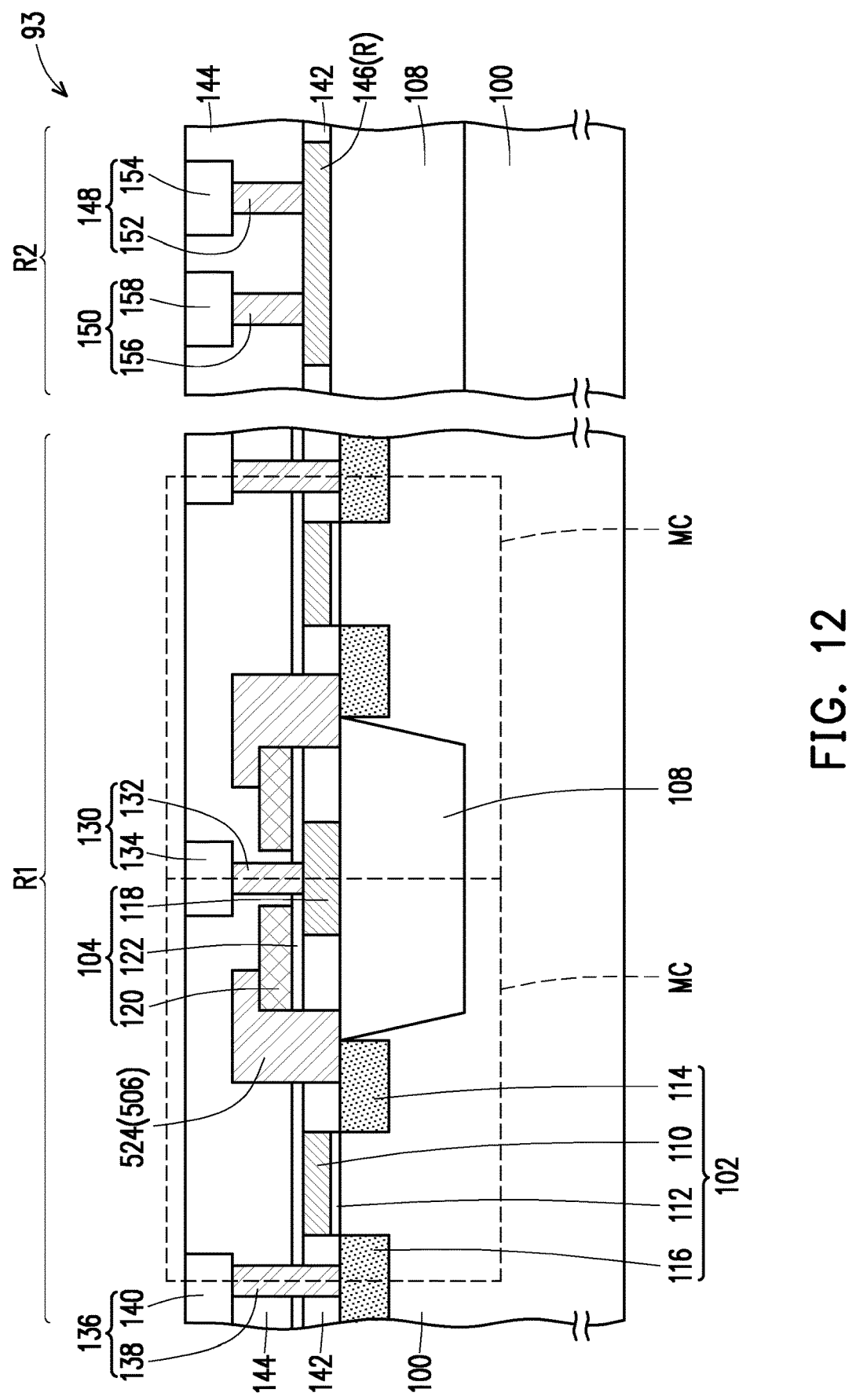

FIG. 12 is a cross-sectional view illustrating an OTP memory structure according to another embodiment of the invention.

DESCRIPTION OF THE EMBODIMENTS

Figure 1A:
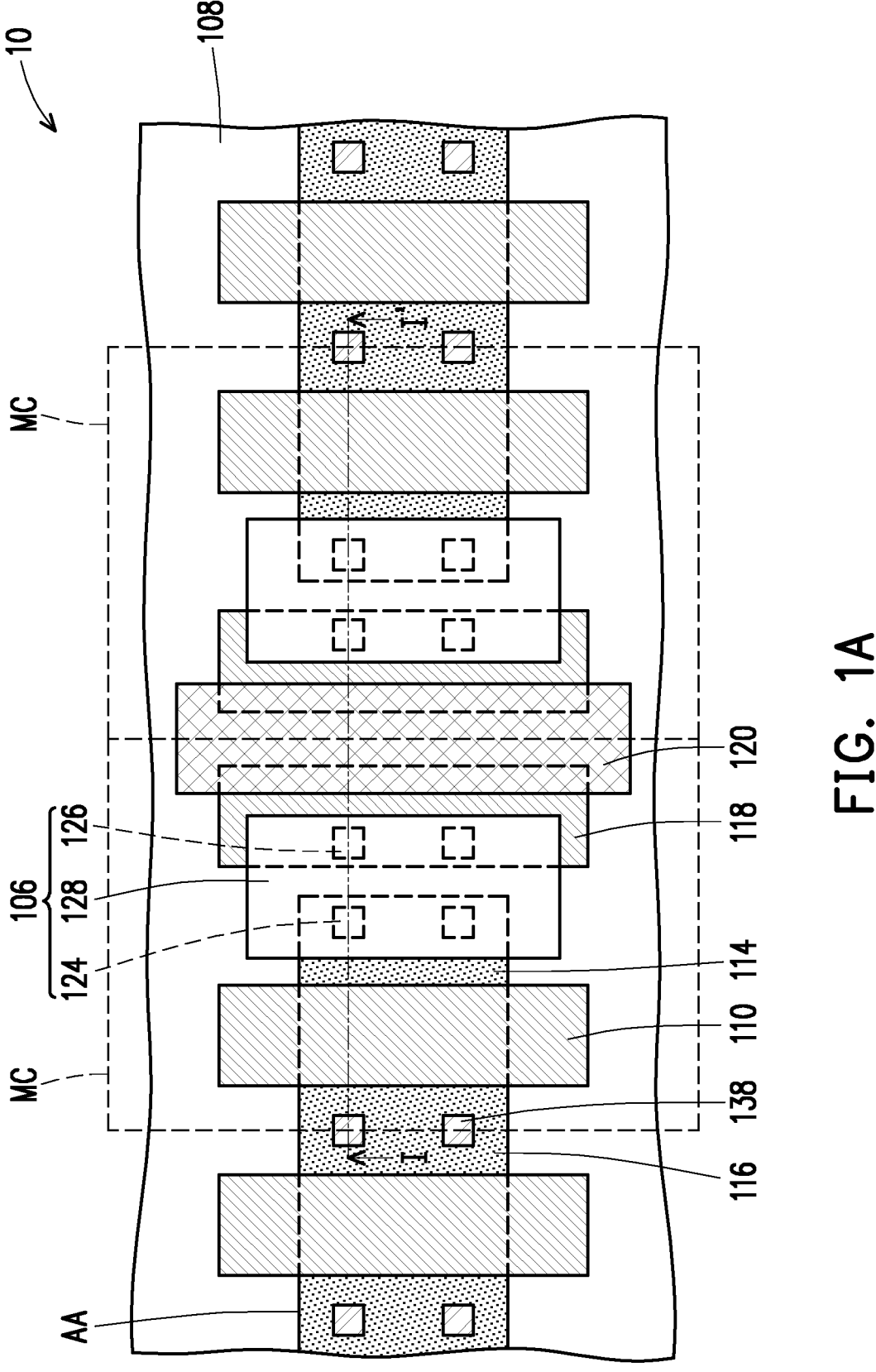
FIG. 1A is a top view illustrating an OTP memory structure according to an embodiment of the invention.
Figure 1B:
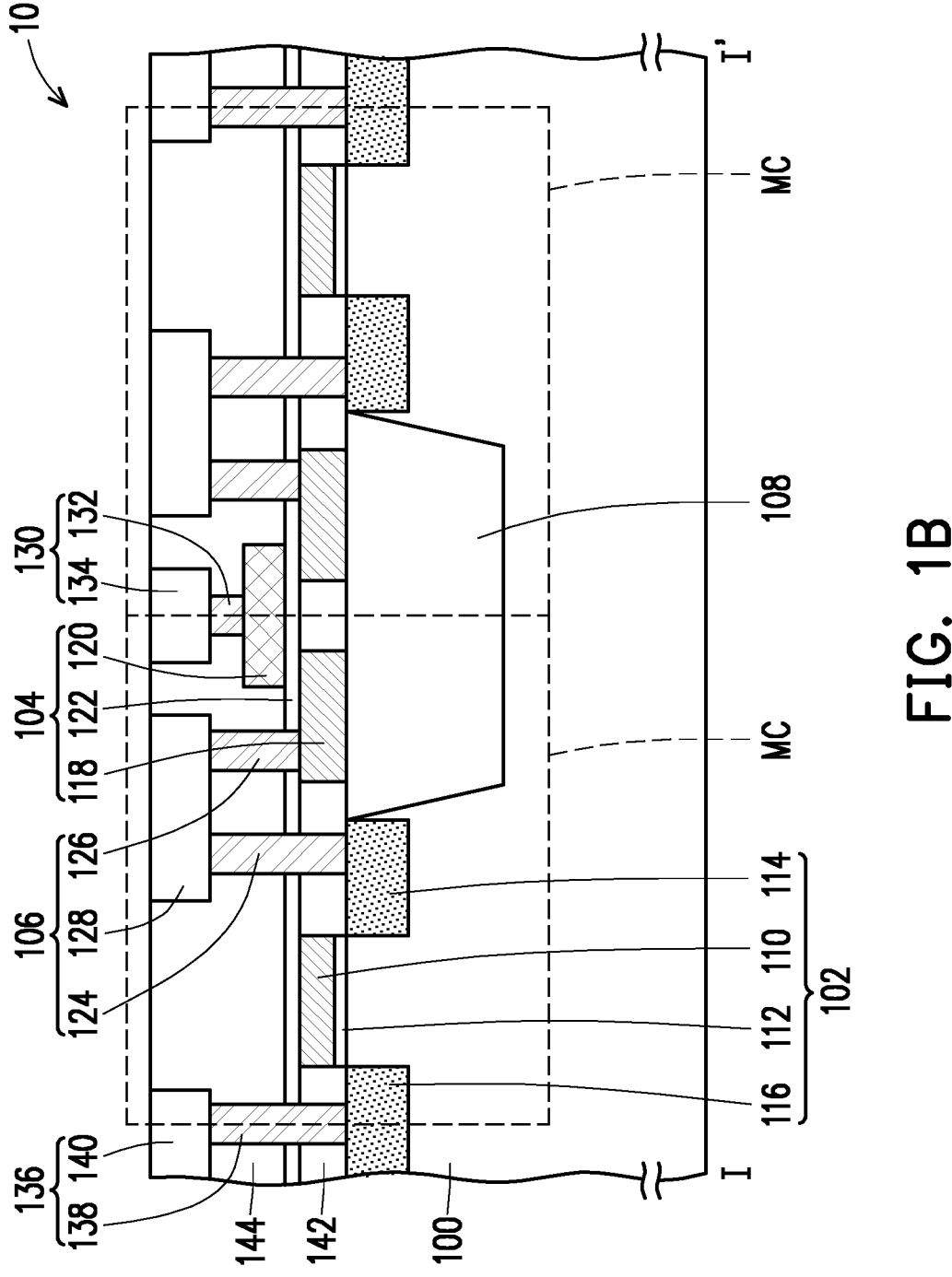
FIG. 1B is a cross-sectional view taken along the section line I-I' in FIG. 1A.

FIG. 1A is a top view illustrating an OTP memory structure according to an embodiment of the invention. FIG. 1B is a cross-sectional view taken along the section line I-I' in FIG. 1A. In addition, some components in FIG. 1B are omitted in FIG. 1A to clearly illustrate the configuration relationship between the components in FIG. 1A.

Referring to FIG. 1A and FIG. 1B, an OTP memory structure 10 includes a substrate 100, a transistor 102, a capacitor 104, and an interconnect structure 106. The substrate 100 may be a semiconductor substrate such as a silicon substrate. Furthermore, the OTP memory structure 10 may further include an isolation structure 108. The isolation structure 108 is located in the substrate 100, so that an active area AA can be defined in the substrate 100. The isolation structure 108 is, for example, a shallow trench isolation (STI) structure. The material of the isolation structure 108 is, for example, silicon oxide.

The transistor 102 is located on the substrate 100. The transistor 102 may include a gate 110, a gate dielectric layer 112, a doped region 114, and a doped region 116. The gate 110 is disposed on the substrate 100. The gate dielectric layer 112 is disposed between the gate 110 and the substrate 100. In some embodiments, the material of the gate 110 may be doped polysilicon, and the material of the gate dielectric layer 112 may be silicon oxide, but the invention is not limited thereto. In other embodiments, the gate 110 and the gate dielectric layer 112 may be formed by a high-k metal gate (HKMG) technology. The doped region 114 and the doped region 116 are located in the substrate 100 on two sides of the gate 110. The doped region 114 and the doped region 116 may be used as one and the other of the source region and the drain region, respectively. In the present embodiment, the doped region 114 may be used as the source region, and the doped region 116 may be used as the drain region, but the invention is not limited thereto. In some embodiments, the transistor 102 may further include other components (not shown) such as a spacer and a lightly doped drain (LDD), and the description thereof is omitted here.

The capacitor 104 includes an electrode 118, an electrode 120, and an insulating layer 122. The electrode 118 is disposed above the substrate 100. For example, the electrode 118 may be disposed on the isolation structure 108. The material of the electrode 118 is, for example, doped polysilicon or metal. In some embodiments, the electrode 118 and the gate 110 may be derived from the same material layer. That is, the electrode 118 and the gate 110 may be formed from the same material layer, so that the process of the transistor 102 and the process of the capacitor 104 can be integrated, thereby reducing the process complexity of the OTP memory structure 10. Moreover, the electrode 118 and the gate 110 may be the same material. The electrode 120 is disposed on the electrode 118. The electrode 118 is located between the electrode 120 and the substrate 100. The material of the electrode 120 is, for example, a high resistivity material. The material of the electrode 120 is, for example, a metal-containing material. In some embodiments, the material of the electrode 120 is, for example, a metal compound such as titanium nitride or tantalum nitride. The insulating layer 122 is disposed between the electrode 118 and the electrode 120. The material of the insulating layer 122 is, for example, silicon oxide.

The interconnect structure 106 is electrically connected between the transistor 102 and the electrode 118 of the capacitor 104. The interconnect structure 106 is electrically connected to the electrode 118 at the top surface of the electrode 118. In some embodiments, the interconnect structure 106 may be in direct contact with the top surface of the electrode 118. For example, the interconnect structure 106 may include a contact 124, a contact 126, and a conductive line 128, but the invention is not limited thereto. The contact 124 is electrically connected to the doped region 114. The contact 126 is electrically connected to the electrode 118. In some embodiments, the contact 126 may be in direct contact with the top surface of the electrode 118. The material of the contact 124 and the contact 126 is, for example, a conductive material such as tungsten. The conductive line 128 is electrically connected between the contact 124 and the contact 126. The material of the conductive line 128 is, for example, a conductive material such as tungsten, aluminum, or copper.

The OTP memory structure 10 may further include an interconnect structure 130. The interconnect structure 130 is electrically connected to the electrode 120. For example, the interconnect structure 130 may include a contact 132 and a conductive line 134. The contact 132 is electrically connected to the electrode 120. The material of the contact 132 is, for example, a conductive material such as tungsten. The conductive line 134 is electrically connected to the contact 132. The material of the conductive line 134 is, for example, a conductive material such as tungsten, aluminum, or copper.

In addition, the OTP memory structure may further include an interconnect structure 136. The interconnect structure 136 is electrically connected to the doped region 116. For example, the interconnect structure 136 may include a contact 138 and a conductive line 140. The contact 138 is electrically connected to the doped region 116. The material of the contact 138 is, for example, a conductive material such as tungsten. The conductive line 140 is electrically connected to the contact 138. The material of the conductive line 140 is, for example, a conductive material such as tungsten, aluminum, or copper. The conductive line 134 and the conductive line 140 may be used as one and the other of the source line and the bit line, respectively. In the present embodiment, the conductive line 134 may be used as the source line, and the conductive line 140 may be used as the bit line, but the invention is not limited thereto.

Furthermore, the OTP memory structure 10 may further include a dielectric layer 142 and a dielectric layer 144. The dielectric layer 142 is disposed between the insulating layer 122 and the substrate 100. The material of the dielectric layer 142 is, for example, silicon oxide, silicon nitride, or a combination thereof. The dielectric layer 144 is disposed on the insulating layer 122. The material of the dielectric layer 144 is, for example, silicon oxide, silicon nitride, or a combination thereof.

In the present embodiment, the transistor 102 and the capacitor 104 electrically connected by the interconnect structure 106 may form a memory cell MC. Two adjacent memory cells MC may be mirror images of each other. The electrodes 118 in the capacitors 104 of two adjacent memory cells MC may be separated from each other. Moreover, the capacitors 104 in two adjacent memory cells MC may share the electrode 120. In the initial state, all memory cells MC are in the "H state" (i.e., high resistance state). After performing the program operation on the selected memory cell MC, the selected memory cell MC will become "L state" (i.e., low resistance state) due to the breakdown of the insulating layer 122 in the capacitor 104.

In addition, the OTP memory structure 10 may further include other required components such as an interconnect structure (not shown) electrically connected to the gate 110, and the description thereof is omitted here.

Based on the above embodiment, in the OTP memory structure 10, since the electrode 118 and the electrode 120 of the capacitor 104 are both disposed above the substrate 100, the noise source caused by arranging the electrode of the capacitor in the substrate can be prevented.

Figure 2A:
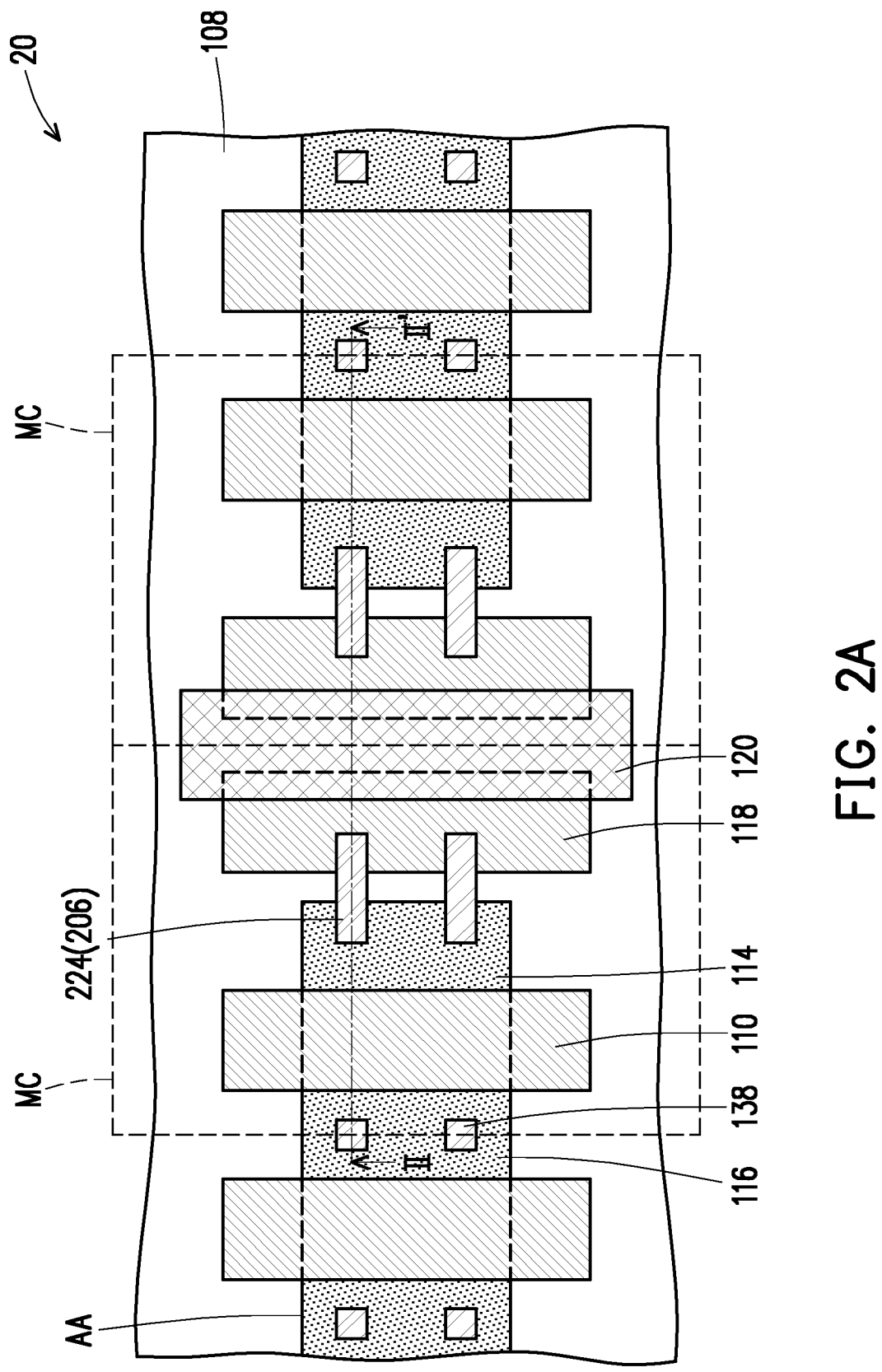
FIG. 2A is a top view illustrating an OTP memory structure according to another embodiment of the invention.
Figure 2B:
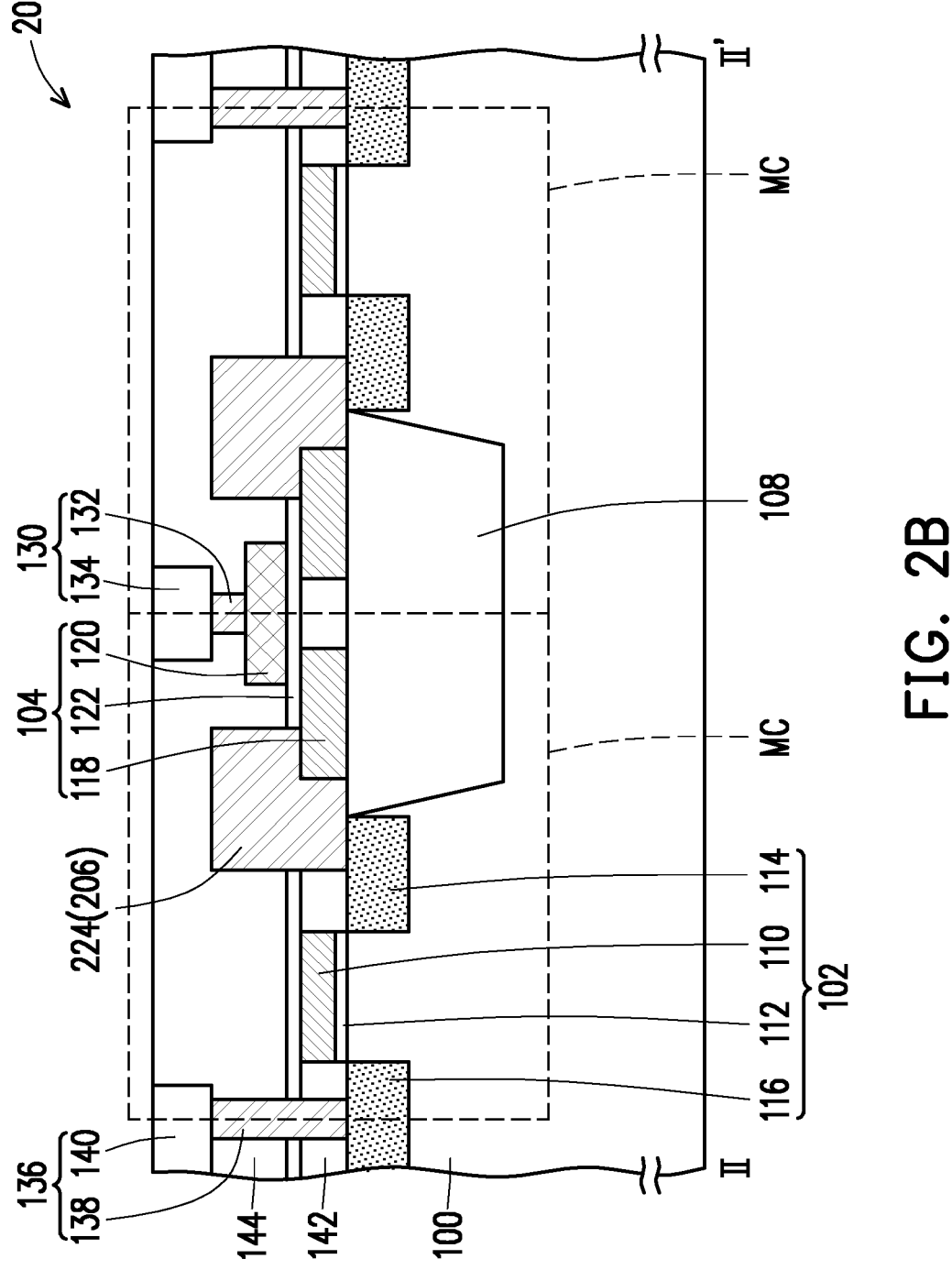
FIG. 2B is a cross-sectional view taken along the section line II-IF in FIG. 2A.

FIG. 2A is a top view illustrating an OTP memory structure according to another embodiment of the invention. FIG. 2B is a cross-sectional view taken along the section line II-IF in FIG. 2A. In addition, some components in FIG. 2B are omitted in FIG. 2A to clearly illustrate the configuration relationship between the components in FIG. 2A.

Referring to FIG. 1A, FIG. 1B, FIG. 2A and FIG. 2B, the difference between the OTP memory structure 20 of FIG. 2A and FIG. 2B and the OTP memory structure 10 of FIG. 1A and FIG. 1B is as follows. In the OTP memory structure 20, the interconnect structure 206 for electrically connecting the transistor 102 and the capacitor 104 may include a contact 224. The contact 224 is electrically connected between the doped region 114 and the electrode 118. In some embodiments, the contact 224 may be in direct contact with the doped region 114 and the electrode 118. The material of the contact 224 is, for example, a conductive material such as tungsten.

Furthermore, the same components in the OTP memory structure 20 and the OTP memory structure 10 are denoted by the same symbols, and the description thereof is omitted here.

Based on the above embodiment, in the OTP memory structure 20, since a single contact 224 can be used as the interconnect structure 206 for electrically connecting the transistor 102 and the capacitor 104, the complexity of the interconnect structure 206 can be reduced.

Figure 3A:
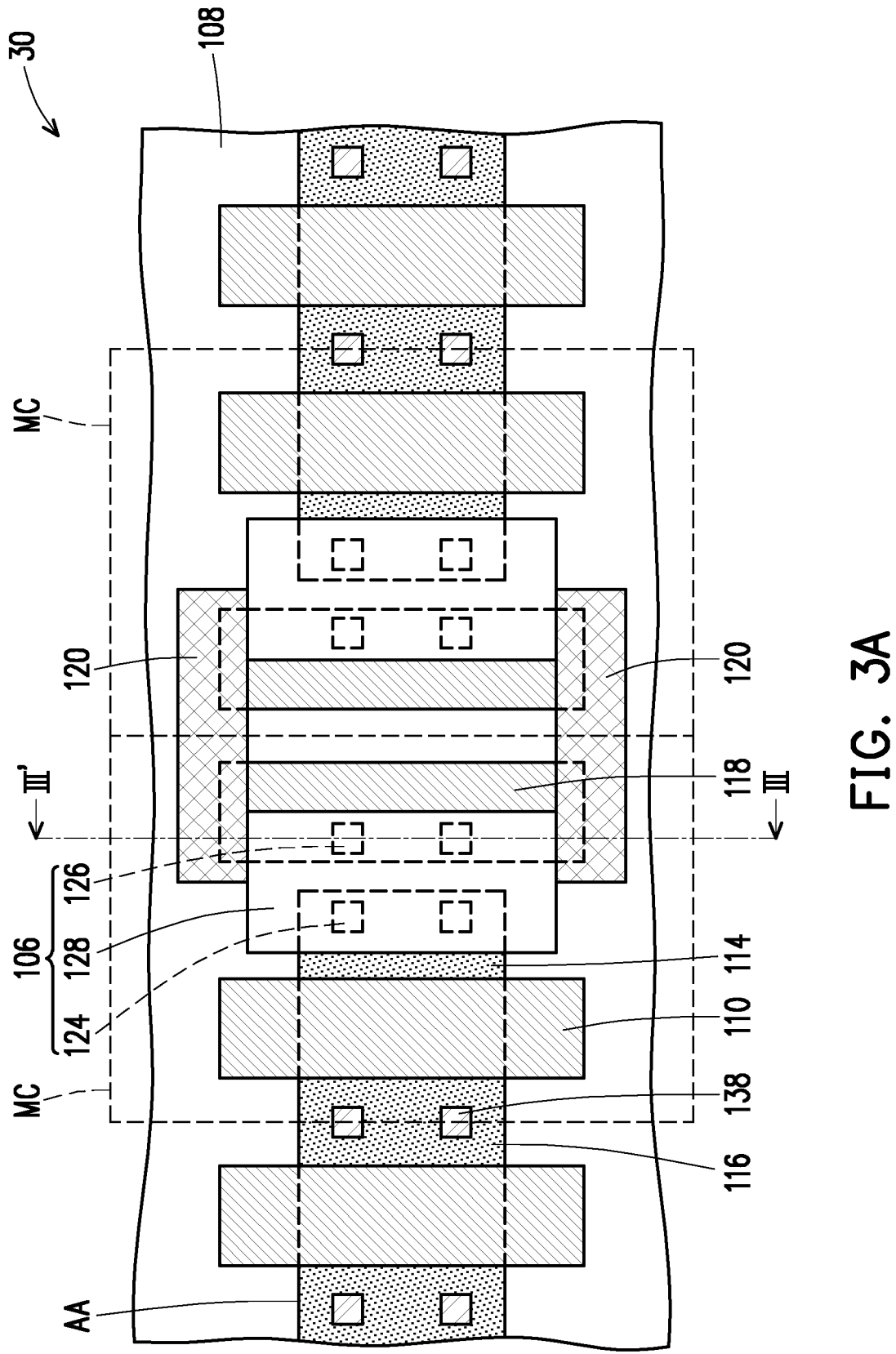
FIG. 3A is a top view illustrating an OTP memory structure according to another embodiment of the invention.
Figure 3B:
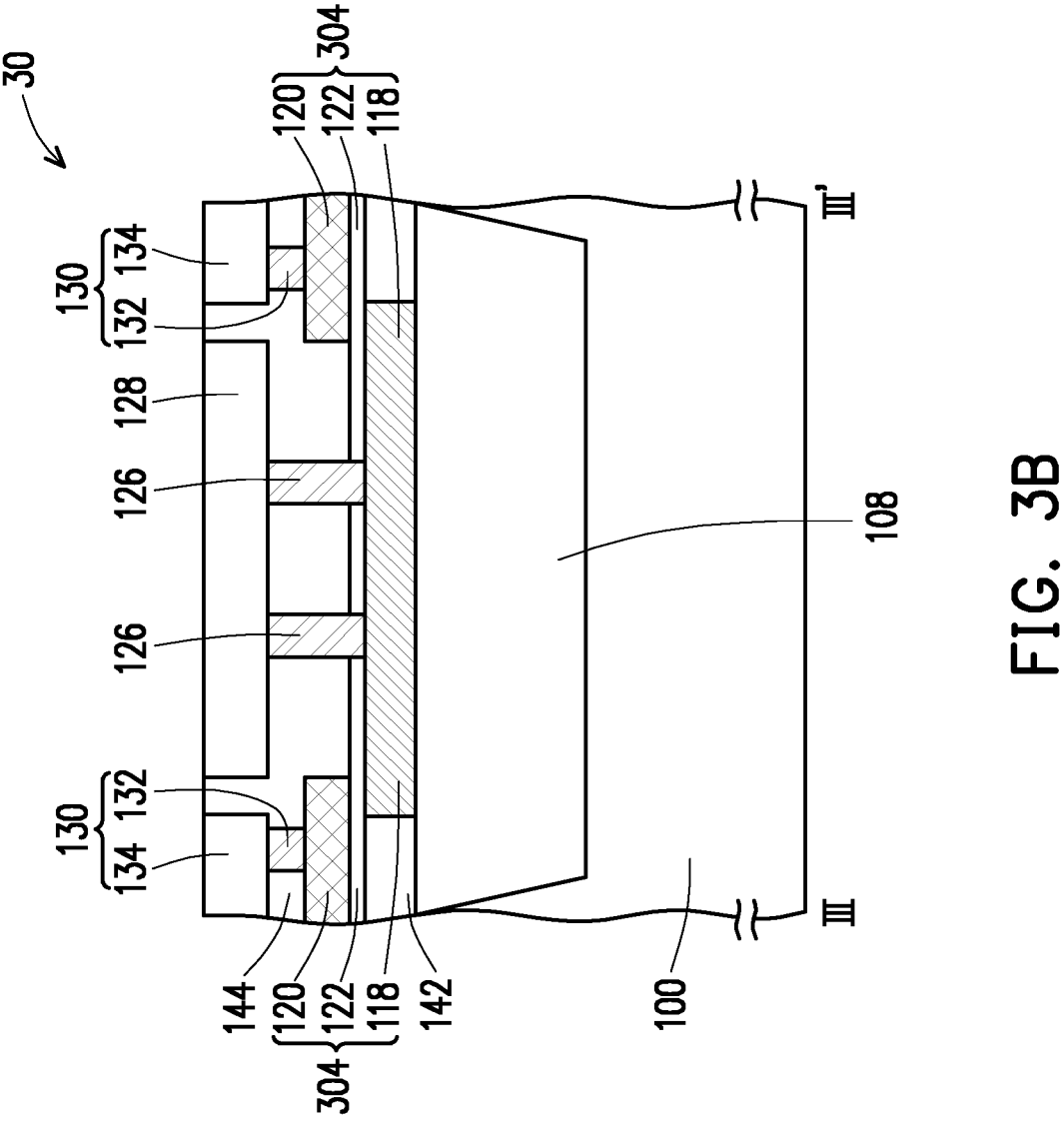
FIG. 3B is a cross-sectional view taken along the section line in FIG. 3A.

FIG. 3A is a top view illustrating an OTP memory structure according to another embodiment of the invention. FIG. 3B is a cross-sectional view taken along the section line III-III' in FIG. 3A. In addition, some components in FIG. 3B are omitted in FIG. 3A to clearly illustrate the configuration relationship between the components in FIG. 3A.

Referring to FIG. 1A, FIG. 1B, FIG. 3A and FIG. 3B, the difference between the OTP memory structure 30 of FIG. 3A and FIG. 3B and the OTP memory structure 10 of FIG. 1A and FIG. 1B and FIG. 1B is as follows. In the OTP memory structure 10, only one capacitor 104 is electrically connected to the transistor 102. On the other hand, the OTP memory structure 30 may include a plurality of the capacitors 304 electrically connected to the same transistor 102. That is, a single memory cell MC of the OTP memory structure 30 may include a plurality of the capacitors 304. In the present embodiment, the number of the capacitors 304 electrically connected to the same transistor 102 is, for example, two, but the invention is not limited thereto. The electrodes 120 of the capacitors 304 electrically connected to the same transistor 102 may be separated from each other (FIG. 3A). The capacitors 304 electrically connected to the same transistor 102 may share the electrode 118. Furthermore, the same components in the OTP memory structure 30 and the OTP memory structure 10 are denoted by the same symbols, and the description thereof is omitted here. Moreover, the rest of the content in the OTP memory structure 30 is similar to that of the OTP memory structure 10, and reference may be made to the description of the memory structure in the above embodiment.

Based on the above embodiment, since the OTP memory structure 30 may include a plurality of the capacitors 304 electrically connected to the same transistor 102, the area of the insulating layer 122 located in the overlapping region of the electrode 120 and the electrode 118 can be reduced, so that the program operation can be optimized.

Figure 4A:
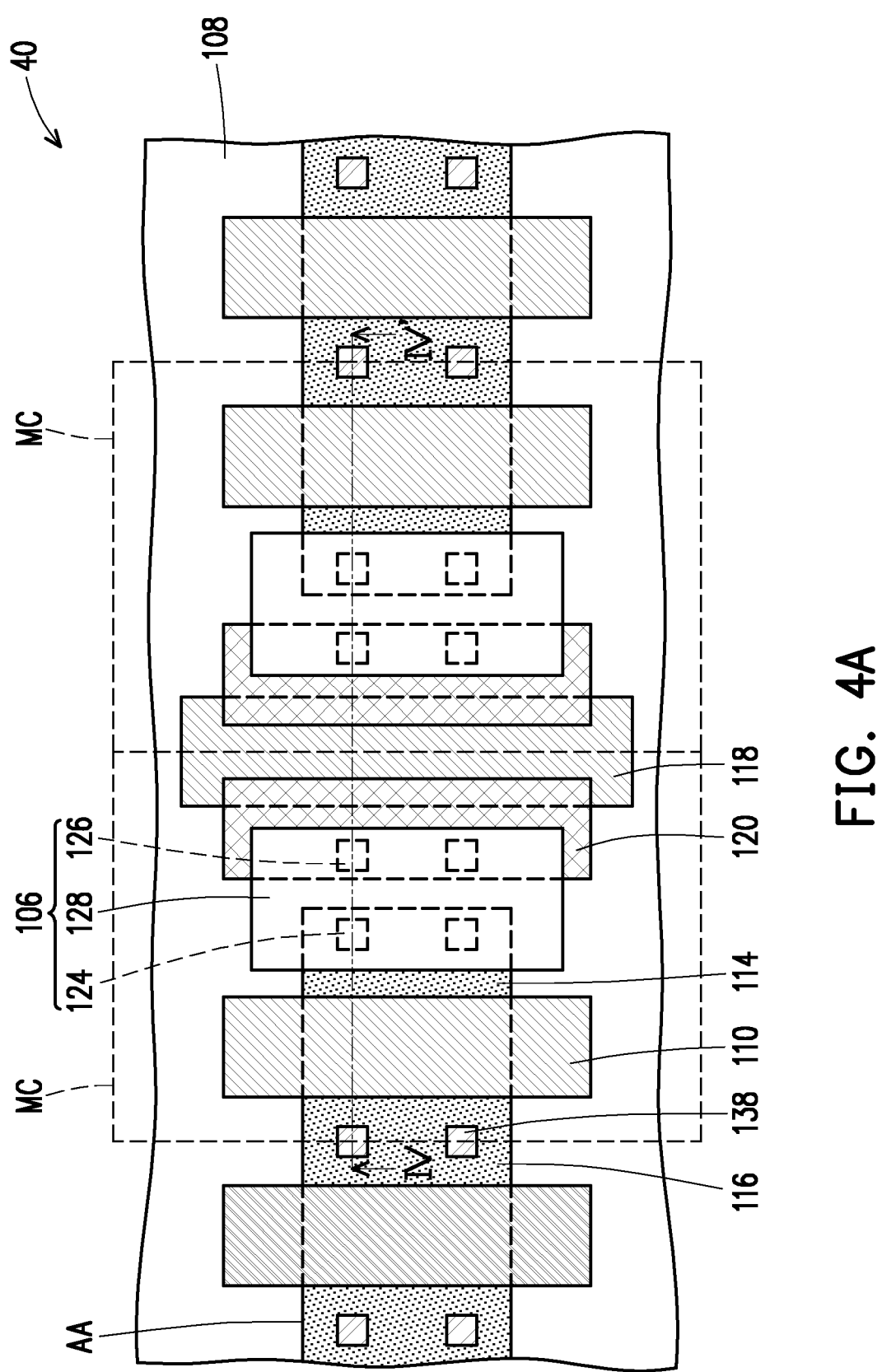
FIG. 4A is a top view illustrating an OTP memory structure according to another embodiment of the invention.
Figure 4B:
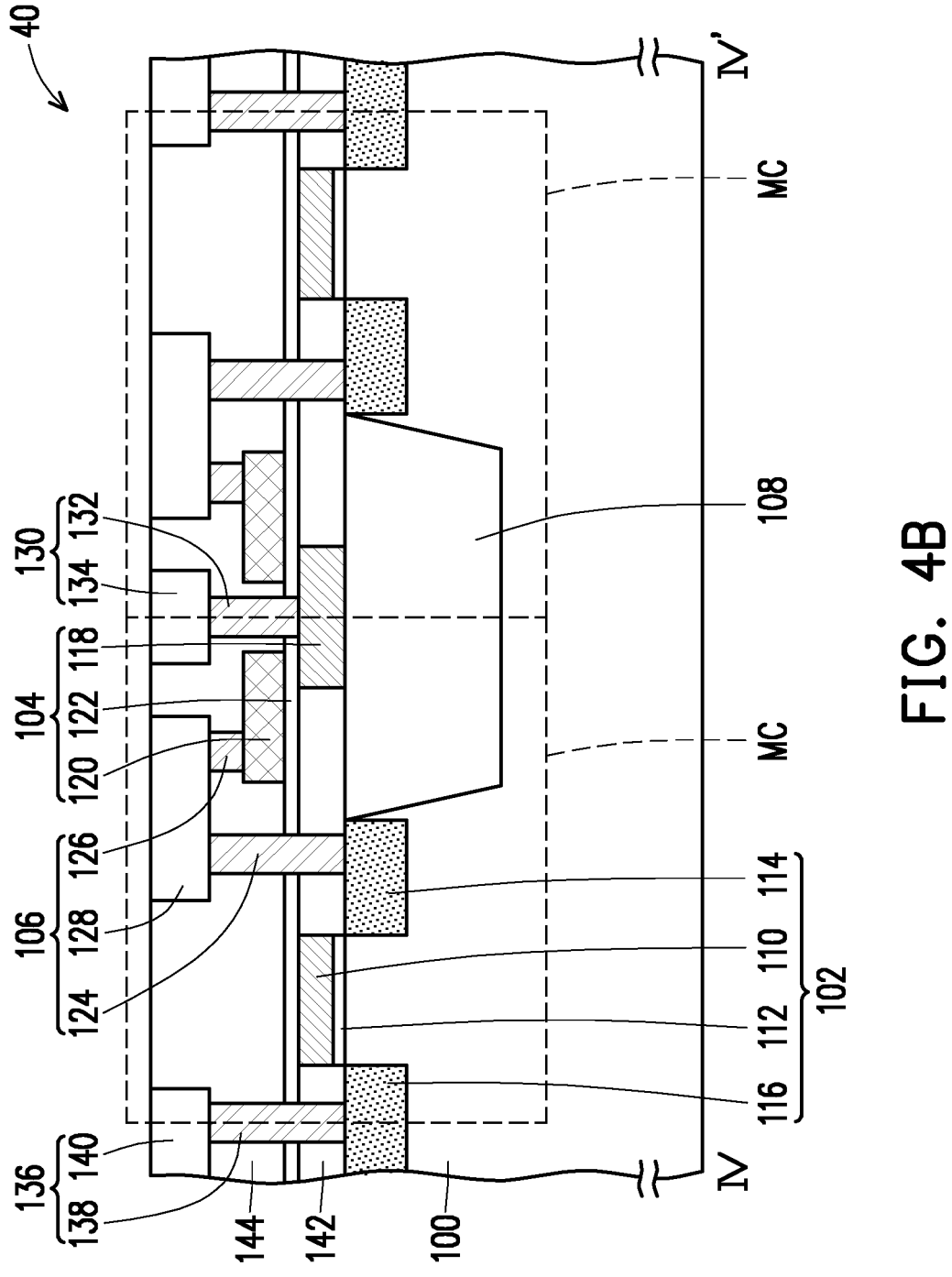
FIG. 4B is a cross-sectional view taken along the section line IV-IV' in FIG. 4A.

FIG. 4A is a top view illustrating an OTP memory structure according to another embodiment of the invention. FIG. 4B is a cross-sectional view taken along the section line IV-IV' in FIG. 4A. In addition, some components in FIG. 4B are omitted in FIG. 4A to clearly illustrate the configuration relationship between the components in FIG. 4A.

Referring to FIG. 1A, FIG. 1B, FIG. 4A and FIG. 4B, the difference between the OTP memory structure 40 of FIG. 4A and FIG. 4B and the OTP memory structure 10 of FIG. 1A and FIG. 1B is as follows. In the OTP memory structure 40, the interconnect structure 106 is electrically connected between the transistor 102 and the electrode 120 of the capacitor 104. The interconnect structure 106 is electrically connected to the electrode 120 at the top surface of the electrode 120. In some embodiments, the interconnect structure 106 may be in direct contact with the top surface of the electrode 120. For example, the contact 126 in the interconnect structure 106 is electrically connected to the electrode 120. In some embodiments, the contact 126 may be in direct contact with the top surface of the electrode 120. The electrodes 120 in the capacitors 104 of two adjacent memory cells MC may be separated from each other. The capacitors 104 in two adjacent memory cells MC may share the electrode 118. The interconnect structure 130 is electrically connected to the electrode 118. Furthermore, the same components in the OTP memory structure 40 and the OTP memory structure 10 are denoted by the same symbols, and the description thereof is omitted here.

Based on the above embodiment, in the OTP memory structure 40, since the electrode 118 and the electrode 120 of the capacitor 104 are both disposed above the substrate 100, the noise source caused by arranging the electrode of the capacitor in the substrate can be prevented.

FIG. 5A is a top view illustrating an OTP memory structure according to another embodiment of the invention. FIG. 5B is a cross-sectional view taken along the section line V-V' in FIG. 5A. In addition, some components in FIG. 5B are omitted in FIG. 5A to clearly illustrate the configuration relationship between the components in FIG. 5A.

Referring to FIG. 4A, FIG. 4B, FIG. 5A and FIG. 5B, the difference between the OTP memory structure 50 of FIG. 5A and FIG. 5B and the OTP memory structure 40 of FIG. 4A and FIG. 4B is as follows. In the OTP memory structure 50, the interconnect structure 506 for electrically connecting the transistor 102 and the capacitor 104 may include a contact 524. The contact 524 is electrically connected between the doped region 114 and the electrode 120. In some embodiments, the contact 524 may be in direct contact with the doped region 114 and the electrode 120. The material of the contact 524 is, for example, a conductive material such as tungsten. Furthermore, the same components in the OTP memory structure 50 and the OTP memory structure 40 are denoted by the same symbols, and the description thereof is omitted here.

Based on the above embodiment, in the OTP memory structure 50, since a single contact 524 can be used as the interconnect structure 506 for electrically connecting the transistor 102 and the capacitor 104, the complexity of the interconnect structure 506 can be reduced.

FIG. 6A is a top view illustrating an OTP memory structure according to another embodiment of the invention. FIG. 6B is a cross-sectional view taken along the section line VI-VI' in FIG. 6A. In addition, some components in FIG. 6B are omitted in FIG. 6A to clearly illustrate the configuration relationship between the components in FIG. 6A.

Referring to FIG. 4A, FIG. 4B, FIG. 6A and FIG. 6B, the difference between the OTP memory structure 60 of FIG. 6A and FIG. 6B and the OTP memory structure 40 of FIG. 4A and FIG. 4B is as follows. In the OTP memory structure 40, only one capacitor 104 is electrically connected to the transistor 102. On the other hand, the OTP memory structure 60 may include a plurality of the capacitors 604 electrically connected to the same transistor 102. That is, a single memory cell MC of the OTP memory structure 60 may include a plurality of the capacitors 604. In the present embodiment, the number of the capacitors 604 electrically connected to the same transistor 102 is, for example, two, but the invention is not limited thereto. The electrodes 118 of the capacitors 604 electrically connected to the same transistor 102 may be separated from each other (FIG. 6A). The capacitors 604 electrically connected to the same transistor 102 may share the electrode 120. Furthermore, the same components in the OTP memory structure 60 and the OTP memory structure 40 are denoted by the same symbols, and the description thereof is omitted here. Moreover, the rest of the content in the OTP memory structure 60 is similar to that of the OTP memory structure 40, and reference may be made to the description of the memory structure in the above embodiment.

Based on the above embodiment, since the OTP memory structure 60 may include a plurality of the capacitors 604 electrically connected to the same transistor 102, the area of the insulating layer 122 located in the overlapping region of the electrode 120 and the electrode 118 can be reduced, so that the program operation can be optimized.

FIG. 7 is a cross-sectional view illustrating an OTP memory structure according to another embodiment of the invention.

Referring to FIG. 1B and FIG. 7, the OTP memory structure 70 of FIG. 7 includes the OTP memory structure 10 of FIG. 1B and further includes a resistor R. In the OTP memory structure 70, the substrate 100 includes a memory region R1 and a resistor region R2. The transistor 102 and the capacitor 104 are located in the memory region R1. The resistor R is located in the resistor region R2 and may include a conductive layer 146. The conductive layer 146 is disposed above the substrate 100. For example, the conductive layer 146 may be disposed above the isolation structure 108. The material of the conductive layer 146 may be a high resistivity material. For example, the material of the conductive layer 146 is, for example, a metal-containing material. In some embodiments, the material of the conductive layer 146 is, for example, a metal compound such as titanium nitride or tantalum nitride. In some embodiments, the conductive layer 146 and the electrode 120 may be derived from the same material layer. That is, the conductive layer 146 and the electrode 120 may be formed from the same material layer, so that the process of the resistor R and the process of the capacitor 104 can be integrated, thereby reducing the process complexity. In addition, the conductive layer 146 and the electrode 120 may be the same material.

The OTP memory structure 70 may further include an interconnect structure 148 and an interconnect structure 150. The interconnect structure 148 and the interconnect structure 150 are electrically connected to the resistor R, respectively. The interconnect structure 148 may electrically connect the resistor R to a voltage source, and the interconnect structure 150 may electrically connect the resistor R to another voltage source. The interconnect structure 148 may include a contact 152 and a conductive line 154. The contact 152 is electrically connected to the resistor R. The material of the contact 152 is, for example, a conductive material such as tungsten. The conductive line 154 is electrically connected to the contact 152. The material of the conductive line 154 is, for example, a conductive material such as tungsten, aluminum, or copper. The interconnect structure 150 may include a contact 156 and a conductive line 158. The contact 156 is electrically connected to the resistor R. The material of the contact 156 is, for example, a conductive material such as tungsten. The conductive line 158 is electrically connected to the contact 156. The material of the conductive line 158 is, for example, a conductive material such as tungsten, aluminum, or copper.

Furthermore, the same components in the OTP memory structure 70 and the OTP memory structure 10 are denoted by the same symbols, and the description thereof is omitted here.

Based on the above embodiment, in the OTP memory structure 70, the process of the resistor R and the process of the capacitor 104 can be integrated, thereby reducing the process complexity.

FIG. 8 is a cross-sectional view illustrating an OTP memory structure according to another embodiment of the invention.

Referring to FIG. 7 and FIG. 8, the difference between the OTP memory structure 80 of FIG. 8 and the OTP memory structure 70 of FIG. 7 is as follows. The OTP memory structure 80 may further include a dummy electrode 160 and a dummy insulating layer 162. The dummy electrode 160 is disposed on the isolation structure 108. The material of the dummy electrode 160 is, for example, doped polysilicon or metal. In some embodiments, the dummy electrode 160 and the electrode 118 may be derived from the same material layer. That is, the dummy electrode 160 and the electrode 118 may be formed from the same material layer. In addition, the dummy electrode 160 and the electrode 118 may be the same material. The dummy insulating layer 162 is disposed between the resistor R and the dummy electrode 160. The material of the dummy insulating layer 162 is, for example, silicon oxide. In some embodiments, the dummy insulating layer 162 and the insulating layer 122 may be derived from the same material layer. That is, the dummy insulating layer 162 and the insulating layer 122 may be formed from the same material layer, and the dummy insulating layer 162 and the insulating layer 122 may be the same material.

Based on the foregoing embodiment, in the OTP memory structure 80, the process of the resistor R and the process of the capacitor 104 can be integrated, thereby reducing the process complexity.

In other embodiments, the structure in the resistor region R2 of the OTP memory structure 70 or the structure in the resistor region R2 of the OTP memory structure 80 may be applied to the OTP memory structure 20 to the OTP memory structure 60.

FIG. 9 is a cross-sectional view illustrating an OTP memory structure according to another embodiment of the invention.

Referring to FIG. 1B and FIG. 9, the OTP memory structure 90 of FIG. 9 includes the OTP memory structure 10 of FIG. 1B and further includes a resistor R. In the OTP memory structure 90, the substrate 100 includes a memory region R1 and a resistor region R2. The transistor 102 and the capacitor 104 are located in the memory region R1. The resistor R is located in the resistor region R2 and may include a conductive layer 146. The conductive layer 146 is disposed above the substrate 100. For example, the conductive layer 146 may be disposed above the isolation structure 108. The material of the conductive layer 146 may be a high resistivity material. For example, the material of the conductive layer 146 is, for example, a metal-containing material. In some embodiments, the material of the conductive layer 146 is, for example, a metal compound such as titanium nitride or tantalum nitride. In some embodiments, the resistor R of the resistor region R2 and the gate 110 of the transistor 102 may be derived from the same material layer, such as high-k material, high-k material or doped polysilicon, etc., but the invention is not limited thereto. That is, the resistor R and the gate 110 may be formed from the same material layer, In addition, the resistor R and the gate 110 may be the same material. In addition, a bottom surface of the resistor R is in the same level with a bottom surface of the gate 110, and a top surface of the resistor R is in the same level with a top surface of the gate 110.

Based on the above embodiments, the process of the resistor R and the process of the transistor 102 can be integrated, thereby reducing the process complexity.

As the OTP memory structure 70 of FIG. 7 and the OTP memory structure 80 of FIG. 8, the OTP memory structure 90 may further include an interconnect structure 148 and an interconnect structure 150. The interconnect structure 148 and the interconnect structure 150 are electrically connected to the resistor R, respectively. The interconnect structure 148 may electrically connect the resistor R to a voltage source, and the interconnect structure 150 may electrically connect the resistor R to another voltage source. The interconnect structure 148 may include a contact 152 and a conductive line 154. The contact 152 is electrically connected to the resistor R. The material of the contact 152 is, for example, a conductive material such as tungsten. The conductive line 154 is electrically connected to the contact 152. The material of the conductive line 154 is, for example, a conductive material such as tungsten, aluminum, or copper. The interconnect structure 150 may include a contact 156 and a conductive line 158. The contact 156 is electrically connected to the resistor R. The material of the contact 156 is, for example, a conductive material such as tungsten. The conductive line 158 is electrically connected to the contact 156. The material of the conductive line 158 is, for example, a conductive material such as tungsten, aluminum, or copper.

Furthermore, the same components in the OTP memory structure 90 and the OTP memory structure 10 are denoted by the same symbols, and the description thereof is omitted here.

In other embodiments, the structure in the resistor region R2 of the OTP memory structure 90 may be applied to the OTP memory structure 20 to the OTP memory structure 60. For example, FIG. 10 is shown the OTP memory structure 91 applying the structure in the resistor region R2 of the OTP memory structure 90 into the OTP memory structure 20 of FIG. 2B, FIG. 11 is shown the OTP memory structure 92 applying the structure in the resistor region R2 of the OTP memory structure 90 into the OTP memory structure 40 of FIG. 4B, and FIG. 12 is shown the OTP memory structure 93 applying the structure in the resistor region R2 of the OTP memory structure 90 into the OTP memory structure 50 of FIG. 5B. But the invention is not limited thereto.

In summary, in the OTP memory structure of the aforementioned embodiment, since the electrodes of the capacitor are all disposed above the substrate, the noise source caused by arranging the electrode of the capacitor in the substrate can be prevented.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A one-time programmable memory structure, comprising:
  a substrate comprising a memory region and a resistor region;
  a transistor located on the substrate and located in the memory region, wherein the transistor comprises a gate disposed on the substrate;
  a capacitor located in the memory region and comprising:
    a first electrode disposed above the substrate;
    a second electrode disposed on the first electrode, wherein the first electrode is located between the second electrode and the substrate, a top surface of the first electrode and a top surface of the gate are located on a same plane perpendicular to a direction of the first electrode toward the second electrode; and
    an insulating layer disposed between the first electrode and the second electrode;
  an interconnect structure electrically connected between the transistor and the first electrode of the capacitor, wherein the interconnect structure is electrically connected to the first electrode at the top surface of the first electrode; and
  a resistor located in the resistor region and comprising:
  a conductive layer disposed above the substrate, a top surface of the conductive layer and the top surface of the gate are located on a same plane perpendicular to the direction of the first electrode toward the second electrode, and a bottom surface of the conductive layer and a bottom surface of the gate are located on a same plane perpendicular to the direction of the first electrode toward the second electrode.

2. The one-time programmable memory structure according to claim 1, wherein the interconnect structure is in direct contact with the top surface of the first electrode.

3. The one-time programmable memory structure according to claim 1, wherein the transistor comprises:
  a gate dielectric layer disposed between the gate and the substrate; and
  a first doped region and a second doped region located in the substrate on two sides of the gate.

4. The one-time programmable memory structure according to claim 3, wherein the first electrode and the gate are derived from a same material layer.

5. The one-time programmable memory structure according to claim 3, wherein the interconnect structure comprises:
  a first contact electrically connected to the first doped region;
  a second contact electrically connected to the first electrode; and
  a conductive line electrically connected between the first contact and the second contact.

6. The one-time programmable memory structure according to claim 3, wherein the interconnect structure comprises:
  a contact electrically connected between the first doped region and the first electrode.

7. The one-time programmable memory structure according to claim 6, wherein the contact is in direct contact with the first doped region and the first electrode.

8. The one-time programmable memory structure according to claim 1, comprising a plurality of the capacitors electrically connected to the same transistor.

9. The one-time programmable memory structure according to claim 1, further comprising:
  an isolation structure located in the substrate, wherein the first electrode is disposed on the isolation structure.

10. The one-time programmable memory structure according to claim 1, wherein the conductive layer and the gate are derived from a same material layer.

11. A one-time programmable memory structure, comprising:
  a substrate comprising a memory region and a resistor region;
  a transistor located on the substrate and located in the memory region, wherein the transistor comprises a gate disposed on the substrate;
  a capacitor located in the memory region and comprising:
    a first electrode disposed above the substrate;
    a second electrode disposed on the first electrode, wherein the first electrode is located between the second electrode and the substrate, a top surface of the first electrode and a top surface of the gate are located on a same plane perpendicular to a direction of the first electrode toward the second electrode; and
    an insulating layer disposed between the first electrode and the second electrode;
  an interconnect structure electrically connected between the transistor and the second electrode of the capacitor, wherein the interconnect structure is electrically connected to the second electrode at a top surface of the second electrode;
  wherein the first electrode and the gate are derived from a same material layer; and
  a resistor located in the resistor region and comprising:
  a conductive layer disposed above the substrate, a top surface of the conductive layer and the top surface of the gate are located on a same plane perpendicular to the direction of the first electrode toward the second electrode, and a bottom surface of the conductive layer and a bottom surface of the gate are located on a same plane perpendicular to the direction of the first electrode toward the second electrode.

12. The one-time programmable memory structure according to claim 11, wherein the interconnect structure is in direct contact with the top surface of the second electrode.

13. The one-time programmable memory structure according to claim 11, wherein the transistor comprises:

a gate dielectric layer disposed between the gate and the substrate; and a first doped region and a second doped region located in the substrate on two sides of the gate.

14. The one-time programmable memory structure according to claim 13, wherein the interconnect structure comprises:

a first contact electrically connected to the first doped region;

a second contact electrically connected to the second electrode; and a conductive line electrically connected between the first contact and the second contact.

15. The one-time programmable memory structure according to claim 13, wherein the interconnect structure comprises:

a contact electrically connected between the first doped region and the second electrode.

16. The one-time programmable memory structure according to claim 15, wherein the contact is in direct contact with the first doped region and the second electrode.

17. The one-time programmable memory structure according to claim 11, comprising a plurality of the capacitors electrically connected to the same transistor.

18. The one-time programmable memory structure according to claim 11, further comprising:

an isolation structure located in the substrate, wherein the first electrode is disposed on the isolation structure.

19. The one-time programmable memory structure according to claim 11, wherein the conductive layer and the gate are derived from a same material layer.

\* \* \* \* \*